United States Patent [19]

Dejon et al.

[11] Patent Number: 4,851,780
[45] Date of Patent: Jul. 25, 1989

[54] TEST HEAD FOR NMR SPECTROMETER

[75] Inventors: Peter Dejon, Rheinstetten-Mörsch; Manfred Spraul, Ettlingen, both of Fed. Rep. of Germany

[73] Assignee: Bruker Analytische Messtechnik GmbH, Rheinstetten, Fed. Rep. of Germany

[21] Appl. No.: 224,975

[22] Filed: Jul. 27, 1988

[30] Foreign Application Priority Data

Aug. 4, 1987 [DE] Fed. Rep. of Germany ....... 3725718

[51] Int. Cl.⁴ ............................................. G01R 33/20
[52] U.S. Cl. .................................... 324/322; 324/318
[58] Field of Search ............... 324/300, 307, 316, 318, 324/321, 322

[56] References Cited

U.S. PATENT DOCUMENTS 3,735,246  5/1973  Glenat et al. ....................... 324/322
4,439,733  3/1984  Hinshaw et al. .................... 324/322
4,665,368  5/1987  Sugiyama et al. .................. 324/318
4,742,304  5/1988  Schnall et al. ..................... 324/322

FOREIGN PATENT DOCUMENTS 3538952  11/1987  Fed. Rep. of Germany .

OTHER PUBLICATIONS

Progress in NMR-Spectroscopy, vol. 12, 1978, pp. 41 to 77, D. I. Hoult: "The NMR Receiver: A Description and Analysis of Design".

Primary Examiner—Stewart J. Levy
Assistant Examiner—Kevin D. O'Shea
Attorney, Agent, or Firm—Helfgott & Karas

[57] ABSTRACT

A test head for NMR spectrometers comprises an rf coil mounted on a carrier pipe and a shielding which extends over at least one section of two parallel conductors extending in the axial direction of the carrier pipe. In order to improve the effect of shielding, the shielding is connected, in an electrically conductive manner, to a turn section of the rf coil which contains a cold point. The shielding is thereby maintained at a fixed neutral potential, relative to the rf voltage supplied, with the result that no fields impairing the measuring accuracy and resolution of the spectrometer can any longer exist in the shielded area. The shielding may be connected directly to one turn section of the coil, for example by soldering.

8 Claims, 1 Drawing Sheet

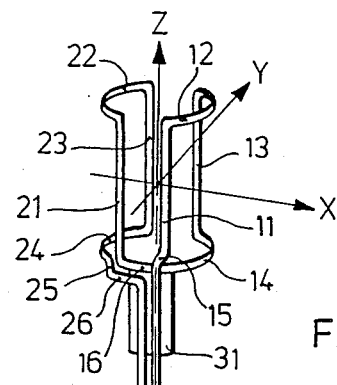
Fig. 1
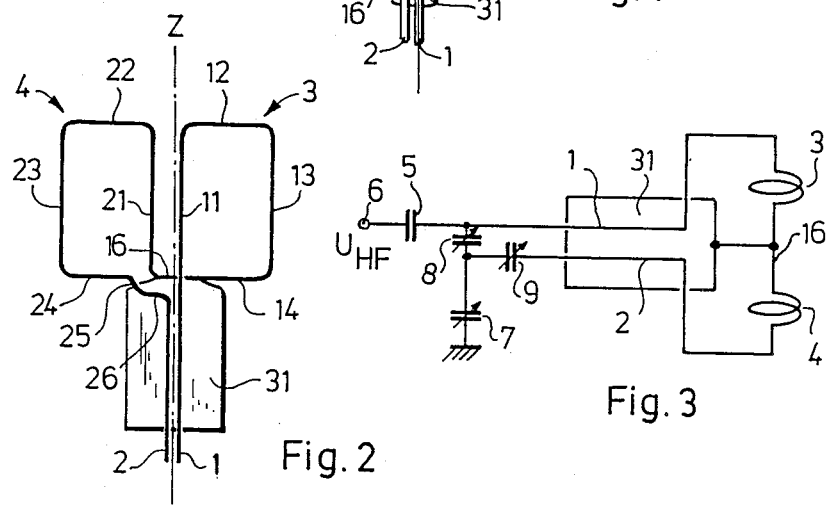
Fig. 2
Fig. 3
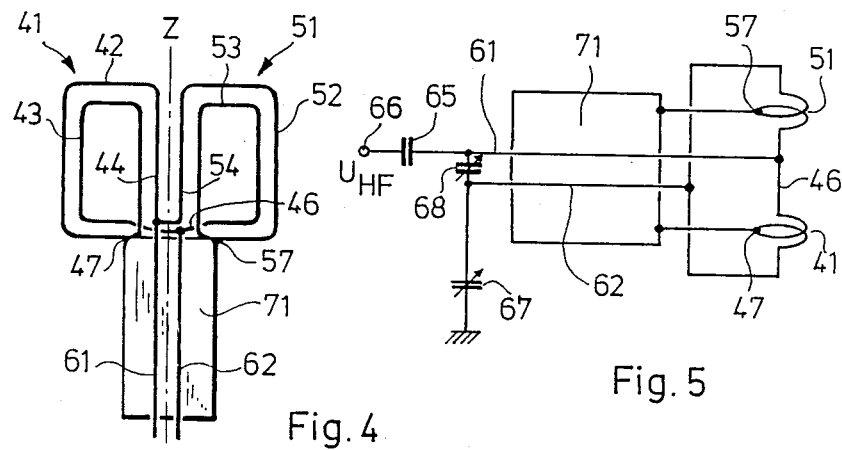
Fig. 4
Fig. 5

TEST HEAD FOR NMR SPECTROMETER

The present invention relates to a test head for NMR spectrometers comprising an rf coil arranged on a carrier pipe, at the end of two parallel conductors extending substantially in the axial direction of the carrier pipe and forming a symmetrical two-conductor line section, and a shielding which extends over at least one section of the two conductors and which is arranged on the side of the two conductors adjacent the axis of the carrier pipe.

The rf coil of the test head for NMR spectrometers serves the purpose to excite a sample located inside the carrier pipe, by generation of an rf magnetic field passing through the sample, and to receive thereafter the signals generated by the excited spins of the sample. The sample is subjected, during this process, not only to the largely homogenous rf magnetic field generated by the rf coil itself, but also to the rf field which is generated by the conductors feeding the rf coil but which has neither the intensity nor the phase relationship required for exciting the sample correctly. Accordingly, parasitic excitation of the sample is encountered in the area of the conductors, which gives rise to interfering signals. The latter include in particular the so-called rotational side bands which result from the fact that a sample which is set into rotation inside a carrier pipe does not rotate perfectly centrally and moves, consequently, relative to the non-homogenous rf magnetic field produced by the conductors, at the frequency of rotation, so that the generated signals are modulated by the frequency of rotation of the sample. The interfering signals generated in this manner are particularly serious in cases where it is intended to measure the spectra of substances suspended in an aqueous solution, in low concentration, because in this case the interfering signals produced by the protons of the water are in the same order of magnitude as the signals produced by the substances to be measured. And what is more, these interfering signals will remain even if the signals generated by the protons of the solvent should be suppressed by saturation of the proton spins.

It has been known to reduce the influence which the rf magnetic field produced by the conductors feeding the rf coil has on the sample by a shielding arranged between the conductors and the sample. For example, an arrangement has been described on pages 62 to 167 of the "Journal of Magnetic Resonance" 72 (1987) where the carrier pipe for the rf coil is introduced into a pipe provided with a highly conductive metallic layer and where the metallic layer forms a circular cylindrical electrically conductive shielding arranged between the conductors and the sample. However, the arrangement of such a shielding beside the carrier pipe is connected with certain problems because the space available inside the carrier pipe is needed for accommodating the receptacle containing the sample which must be capable of rotating freely in the carrier pipe. Due to the fact that the dimensions of the carrier pipe are anyway very small, the space available often does not suffice to accommodate such an additional metal-coated pipe.

On the other hand, arrangements have been known where the shieldings are provided on the outside of the carrier pipe and where the conductors leading to the rf coil are passed across these shieldings at a certain distance. The shieldings consist substantially of metallic rings surrounding the carrier pipe.

However, it is a problem of this arrangement that the rf coils of the test heads of NMR spectrometers are part of a tuned resonant circuit having a very high Q factor and that the shielding must not impair neither the Q factor nor the tuning of the resonant circuit. The capacitors required for tuning the resonant circuits are arranged at the ends of the conductors opposite the coil so that the inductance and capacitance values of the conductors enter into the resonant circuits. Consequently, one may not connect the shielding to earth, for example, as this would inadmissibly change the resonance behavior of the resonant circuit containing the rf coil.

It is the result of all these difficulties that, while the measures for shielding the conductors actually led to a reduction of the latters' detrimental influence, the remaining interference is still serious enough to limit very notably the efficiency of NMR spectrometers. Accordingly, it is the object of the present invention to develop a test head for NMR spectrometers of the type described above so as to improve considerably the suppression of any interference caused by the rf magnetic fields generated by the conductors. This object is achieved in a surprisingly simple way by the fact that the shielding is connected, in an electrically conductive manner, to at least one turn section (16; 47, 57) of the rf coil which is at the zero potential of the push-pull wave supplied via the two-wire line.

In the case of an rf coil which is fed symmetrically via a two-wire line, the alternating voltages present at the respective ends are phase-shifted by 180° so that the voltage drop along the coil necessarily leds to a defined point where the potential corresponds to the zero value of the alternating voltage, regardless of the momentary value of the potentials present at the ends of the coil. This point of the coil, which is free of any alternating voltage, is usually described as "cold point". Now, when the shielding is connected to this cold point, it is maintained at the zero potential which is invariable relative to the alternating voltages whereby the shielding effect is considerably improved.

The considerably improved shielding effect is not only obtained when the shielding is designed—as was usual heretofore—in the form of a closed annular structure, in particular a cylinder arranged concentrically to the axis of the carrier pipe; rather, it is sufficient to arrange the shielding only in an area neighboring the two conductors. According to a preferred embodiment of the invention, therefore, the shielding consists of a shielding plate arranged on the outside of the carrier pipe and extending in parallel to the conductors.

The arrangement of such a shielding plate is on the one hand particularly easy, and offers in addition the particular advantage that the plate may consist of the same material as the wires of the rf coil. For, if only a relatively narrow strip of sheet material is required to provide the desired shielding effect, such a strip may well be produced by giving a corresponding piece of wire the desired shape.

For the purpose of establishing the connection between the shielding and the cold point of the rf coil, an arrangement is particularly advantageous where the turn section exhibiting the zero potential of the push-pull wave or, to say it in other words, the turn section containing the cold point of the rf coil is arranged adjacent that point where the two conductors join the windings of the rf coil so that no special connections crossing portions of conductors or turns have to be established between the shielding and the cold point of the rf coil and the shielding may extend directly to the turn section of the rf coil containing the cold point of the rf coil, without interfering with the active area of the turns of the coil and without impairing thereby the homogeneity of the rf magnetic field generated by the rf coil.

According to a first preferred embodiment of the invention, the rf coil comprises two winding sections connected in series, and the shielding is connected in an electrically conductive manner to the turn section interconnecting the two winding sections. The rf coil may in this case have the conventional design of a saddle coil comprising two winding sections connected in series which are arranged diametrically opposite each other, related to the carrier pipe, and which are interconnected by a turn section crossing at least one of the two conductors, which turn section is then connected with the shielding in an electrically conductive manner.

According to a second preferred embodiment of the invention, the rf coil comprises two winding sections connected in parallel, and the shielding is connected in an electrically conductive manner to the turn sections of the rf coil containing the "cold" center points of the two winding sections. This embodiment can be implemented also when the rf coil has the conventional design of a saddle coil which then comprises two winding sections connected in parallel and arranged diametrically opposite each other, relative to the carrier pipe. The winding sections are then designed in such a way that the turn sections containing the center points are arranged adjacent the two conductors.

The invention will now be described and explained in greater detail with reference to certain embodiments illustrated in the drawing. The features that can be derived from the following descriptioa and the drawing may be used in other embodiments of the invention either individually or in any desired combination. In the drawing FIG. 1 shows a perspective representation of the rf coil of a test head according to the invention, in greatly enlarged scale;

FIG. 2 is a diagrammatic developed view of the rf coil according to FIG. 1;

FIG. 3 shows the circuit diagram of the rf coil according to FIG. 1, in connection with coupling and tuning capacitors;

FIG. 4 shows another diagrammatic developed view of an rf coil for a test head according to the invention; and FIG. 5 shows the circuit diagram of the rf coil according to FIG. 4, in connection with coupling and tuning capacitors.

The rf coil illustrated in FIGS. 1 to 3 is sort of a Helmholtz coil comprising two spaced winding sections 3,4 each of which consists of one turn only. The two winding sections 3,4 are bent in such a manner that they are in intimate contact with the periphery of a carrier pipe not shown in the drawing. The first one of the two winding sections comprises a first turn section 11 forming substantially the extension of a conductor 1 arranged in parallel to the axis Z of the carrier pipe which is not shown in detail. The upper end of the turn section 11—as viewed in FIG. 1—is followed by a turn section 12 extending in the peripheral direction of the pipe. The section 12 is followed by a turn section 13 Which extends in parallel, but in opposite direction to the first turn section 11 and which exhibits approximately the same length as the latter. The section 13 in turn is followed by a turn section 14 which extends in the peripheral direction of the carrier pipe—not shown in the drawing—and in the direction towards the conductor 1 and the first turn section 11, and which crosses the conductor 1 which for this purpose comprises a bent-off portion 15 at the transition to the first turn section 11 so that the two elements do not get into contact with each other at the crossing point. It can be seen that the turn sections 11, 12, 13, 14 form a closed frame and, accordingly, a complete winding of the rf coil.

The first winding just described is followed by a second winding which comprises again a first turn section 21 following the end of the turn sction 14 of the first winding which crosses the conductor 1, and extending in parallel to the first turn section 11, in the axial direction of the carrier pipe not shown in detail. The described first section 21 is followed by additional sections 22, 23 and 24 provided in mirror-symmetrical arrangement to the corresponding sections 12, 13 aad 14 of the first winding, and the section 24 is followed, via a bent-off portion 25, by a section 26 extending in parallel to the conductor portion 16 connecting the two turns, whereafter it joins the second conductor 2 which, just as the first conductor 1, serves to supply the rf coil with an rf pulse or to transmit the signal received from the rf coil to corresponding receiver means.

FIG. 2 shows once more a diagrammatic representation of the rf coil just described. One can see two winding sections 3 and 4 being interconnected by the turn section 16 to form one complete winding of the rf coil each, the first winding section 3 comprising the turn sections 11 tO 14, and the second winding section 4 comprising the turn sections 21 to 24. The two conductors 1 and 2 lead to the ends of the winding sections 3 and 4, opposite the interconnecting turn section 16, so that the two winding sections are connected is series, as is clearly illustrated by the circuit diagram of FIG. 3. The first conductor 1 of the two conductors is connected to a terminal 6, via a capacitor 5, and the terminal can be selectively connected to transmitter or receiver means not shown in the drawing. The second conductor 2 is connected to earth via a tunable capacitor 7. A second tunable capacitor 8 is arranged between the two conductors 1 and 2, and a further tunable capacitor 9 is provided in the second conductor 2. The capacitor 8, which is connected in parallel to the two winding sections 3, 4 enables the parallel resonant circuit formed by the series-connected winding sections 3 and 4 and the capacitor 8 to be tuned to the frequency of the rf signal to be transmitted. The tunable capacitor 9, which is connected in series to the one winding section 4, enables any differences between the winding sections 3 and 4 to be compensated in such a manner that the turn section 16 interconnecting the winding sections 3 and 4 is at a medium potential, related to the rf voltage, i.e. at a fixed zero potential related to the rf voltages applied in push-pull to the conductors 1 aad 2. As, consequently, no alternating voltage is encountered in the turn section 16 interconnecting the winding sections 3 and 4, this point of the rf coil is also described as "cold point". The adjustable capacitor 7, which connects the second conductor 2 to earth, coacts with the capacitor 5 arranged in the first conductor 1 to fix the potential encountered during operation at the cold point 16.

According to the invention, the turn section 16 containing the cold point is connected to a shielding 31 which—as can be seen best in FIG. 1—consists of a strip which is made from a material exhibiting high electric conductivity and which extends in parallel to the two conductors 1, 2 and between these conductors and the axis Z of the carrier pipe not shown in the drawing. Being connected to the cold point of the rf coil, the shielding is at a fixed potential, relative to the conductors 1 and 2, with the result that the shielding itself is not subjected to alternating voltages and, accordingly, not capable of generating an alternating field inside the carrier pipe. Quite to the contrary, it shields the two conductors 1, 2 safely from the inside of the carrier pipe, and this the more as, when the rf coil is properly tuned, the two conductors 1 and 2 carry voltages of opposite phase so that the shielding is "cold" relative to these conductors, too. The low capacitances prevailing between the two conductors 1 and 2 and the shielding and entering into the resonance tuning of the rf coil can be compensated easily by corresponding adjustment of the before-described capacitors 7 to 9.

The described test head is on the one hand very efficient and exhibits on the other hand a very simple structure. It is important in this connection that in the case of the described embodiment of the rf coil the turn section 16 containing the cold point is arranged adjacent that point where the two conductors 1,2 join the winding sections 3, 4 of the rf coil. This makes it possible to connect simply one edge of the shielding 31 to the turn section 16, a solution which provides the additional advantage that the shielding commences directly at the edge of the rf coil and is, accordingly, capable of protecting the sample efficiently from the influence of the rf fields generated by the conductors extending outside the coil. On the other hand, the effective cross-section of the rf coil is not impaired by the shielding.

Regarding now the embodiment of the invention illustrated in FIGS. 4 and 5, the rf coil, instead of comprising two winding sections connected in series, comprises two winding sections 41, 51 connected in parallel and consisting each of two turns 42, 52 and 52, 53, respectively, arranged within each other in the form of a frame. Similar to the rf coil illustrated in FIG. 1, the one conductor 61 is connected to the two turn sections of the outer turns 42, 52, which are arranged adjacent each other and which extend in parallel to the axis Z of the carrier pipe not shown in the drawing, while the other conductor 62 is connected to a turn section 46 interconnecting the inner turns 34, 53 and extending transversely to the conductors 61, 62.

As in the case of the embodiment described before, the one conductor 61 is again connected to a terminal 66, via a capacitor 65, and tunable capacitors 67 and 68 are arranged between earth and the line 62, or between the conductors 61, 62. As can be seen clearly in the diagram of FIG. 5, the capacitor 68 forms with each of the two winding sections 41. 51 a parallel resonant circuit so that the two parallel resonant circuits can be tuned simultaneously to the frequency of the rf signal by means of the capacitor 68. If necessary, it is possible in this case, too, to connect a tunable capacitor in series to one of the two windings for enabling the two resonant circuits to be exactly balanced. The tunable capacitor 67 serves again for adjusting the zero potential for the alternating voltage which is supplied to the rf coil by the two conductors 61, 62, again in push-pull.

Due to the parallel connection of the two winding sections 41, 51, the neutral potential, related to the applied alternating voltage, i.e. the cold point of the rf coil, occurs in this case not between the two winding sections 41, 51 but in the middle of each of the two winding sections, i.e. at points 47, 57, the whole rf voltage being applied to each of the winding sections. Consequently, the shielding 71 is electrically connected to those points. As illustrated diagrammatically in FIG. 4, the cold points 47, 48 are found at the corners of the outer turns 42, 52 facing each other and neighboring also the conductors 61, 62. Consequently, it is again possible to provide a direct electrically conductive connection between the shielding 71 and the turn portions containing the cold points 47, 57, for example by soldering.

In the case of this embodiment, too, the shielding 71 takes the form of a narrow strip made from a material exhibiting very high electric conductivity, for example a susceptibility-compensated copper film, and one obtains here, too, the advantages described before which are derived from the fact that the shielding is connected to the cold point of the rf coil and from the special design and arraagement of this shielding.

It goes without saying that the invention is not limited to the embodiments shown, but that deviations are possible without leaving the scope of the invention. As has been explained before, the essential advantages are achieved solely by the fact that the shielding is connected to at least one cold point of the rf coil whereby it is maintained at a fixed potential, related to the rf voltages encountered, while on the other hand no structures are encountered which might develop an interfering resonaoce of their own. The necessity to establish an electrically conductive connection to the rf coil does not by any means present any problems, but makes it possible to arrange the shielding directly adjacent the effective sections of the rf coil. The man of the art is then also free to select the shape of the shielding according to the requirements of the particular case, and may in particular also provide annular or cylindrical structures surrounding the carrier pipe, instead of the illustrated band or strip-like structures. All this shows that many ways are available to the man of the art to modify the invention at his discretion in order to adapt it optimally to the requirements of the particular case, without thereby leaving the scope of the invention.

We claim:

1. Test head for NMR spectrometers comprising an rf coil arranged on a carrier pipe, at the end of two parallel conductors extending substantially in the axial direction of the carrier pipe and forming a symmetrical two-conductor line section, and a shielding which extends over at least one section of the two conductors and which is arranged on the side of the two conductors adjacent the axis of the carrier pipe, characterized in that the said shielding is connected, in an electrically conductive manner, to at least one turn section of the said rf coil which is at the zero potential of the push-pull wave supplied via the said two-wire line.

2. Test head according to claim 1, characterized in that the turn section exhibiting the zero potential of the push-pull wave is arranged adjacent that point where the two conductors join the said windings of the said rf coil.

3. Test head according to claim 1, characterized in that the said rf coil comprises two winding sections connected in series, and the said shielding is connected in an electrically conductive manner to the turn section interconnecting the two winding sections.

4. Test head according to claim 3, characterized in that the said rf coil has the conventional design of a saddle coil comprising two winding sections connected in series which are arranged diametrically opposite each other, related to the carrier pipe, and which are interconnected by a turn section crossing at least one of the two conductors, and that the said shielding is connected with this turn section in an electrically conductive manner.

5. Test head according to claim 1, characterized in that the said rf coil comprises two winding sections connected in parallel, and the said shielding is connected in an electrically conductive manner to the turn sections of the rf coil containing the center points of the two winding sections.

6. Test head according to claim 5, characterized in that the said rf coil has the conventional design of a saddle coil which comprises two winding sections connected in parallel and arranged diametrically opposite each other, relative to the carrier pipe, the turn sections containing the center points of the winding sections being arranged adjacent the two conductors.

7. Test head according to claim 1, characterized in that the said shielding is formed by a shielding plate arranged on the outside of the said carrier pipe and extending in parallel to the said conductors.

8. Test head according to claim 7, characterized in that the said shielding plate is made from the same material as the wires of the said rf coil.

* * * * *